(12) United States Patent
Yamashita

(10) Patent No.: US 10,024,505 B2
(45) Date of Patent: Jul. 17, 2018

(54) LIGHT EMITTING DEVICE

(71) Applicant: NICHIA CORPORATION, Anan-shi, Tokushima (JP)

(72) Inventor: Toshiaki Yamashita, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 1 day.

(21) Appl. No.: 15/465,967

(22) Filed: Mar. 22, 2017

(65) Prior Publication Data

US 2017/0276299 A1    Sep. 28, 2017

(30) Foreign Application Priority Data

Mar. 25, 2016    (JP) .................. 2016-061390

(51) Int. Cl.
*F21K 9/64*    (2016.01)
*F21V 3/00*    (2015.01)
*F21V 8/00*    (2006.01)
*G02B 6/26*    (2006.01)
*H01S 5/022*   (2006.01)
(Continued)

(52) U.S. Cl.
CPC .................. *F21K 9/64* (2016.08); *F21V 3/00* (2013.01); *F21V 9/30* (2018.02); *G02B 6/0008* (2013.01); *G02B 6/26* (2013.01); *H01S 5/005* (2013.01); *H01S 5/022* (2013.01); *H01S 5/02296* (2013.01); *F21Y 2115/30* (2016.08); *G02B 6/4204* (2013.01); *H01S 5/02212* (2013.01); *H01S 5/02284* (2013.01)

(58) Field of Classification Search
CPC ..... F21K 9/64; F21V 9/30; F21V 3/00; H01S 5/02296; H01S 5/005; H01S 5/02284; H01S 5/02212; G02B 6/26; G02B 6/0008; G02B 6/4204
See application file for complete search history.

(56) References Cited

U.S. PATENT DOCUMENTS

2008/0116473 A1    5/2008  Sugiyama
2011/0141763 A1    6/2011  Kamee et al.
(Continued)

FOREIGN PATENT DOCUMENTS

JP    2008-153617 A    7/2008
JP    2011-014587 A    1/2011
(Continued)

*Primary Examiner* — David V Bruce

(57) ABSTRACT

A light emitting device includes a semiconductor laser element, a support member and a wavelength conversion member. The support member defines a through-hole through which laser light emitted from the semiconductor laser element passes. The wavelength conversion member has a lateral surface fixed to an inner wall of the through-hole, a first main surface having a first region to which the laser light is incident, a second main surface opposite to the first main surface, and an inclined surface connected to the second main surface and the lateral surface. The inclined surface is inclined such that a thickness of a peripheral portion of the wavelength conversion member is thinner than a thickness of a center portion of the wavelength conversion member. The inclined surface partially overlaps with the first region of the first main surface in plan view.

12 Claims, 3 Drawing Sheets

(51) Int. Cl.
   *H01S 5/00*   (2006.01)
   *F21V 9/30*   (2018.01)
   *F21Y 115/30*  (2016.01)
   *G02B 6/42*    (2006.01)

(56) References Cited

U.S. PATENT DOCUMENTS

2014/0160759 A1\*  6/2014  Hayashi et al. .......... F21V 7/22
2015/0077972 A1   3/2015  Sugiyama et al.
2017/0009958 A1   1/2017  Hayashi et al.

FOREIGN PATENT DOCUMENTS

| JP | 2011-123368 A | 6/2011 |
| JP | 2015-019040 A | 1/2015 |
| JP | 2015-060871 A | 3/2015 |

\* cited by examiner

LIGHT EMITTING DEVICE

CROSS-REFERENCE TO RELATED APPLICATIONS

This application claims priority to Japanese Patent Application No. 2016-061390 filed on Mar. 25, 2016. The entire disclosures of Japanese Patent Application No. 2016-061390 are incorporated herein by reference.

BACKGROUND

1. Technical Field

The present disclosure relates to a light emitting device.

2. Description of Related Art

Various laser devices including a fluorescent material-containing member have been heretofore proposed as light emitting devices (e.g. JP 2015-19040 A and JP 2011-123368 A).

SUMMARY

However, in conventional laser devices, laser light has an extremely high intensity at its central part, and therefore color unevenness occurs in light that has passed through a fluorescent material.

The present application has been made in view of the problem described above, and an object of the present application is to provide a light emitting device including a laser element, the light emitting device being capable of reducing color unevenness.

A light emitting device of certain embodiments of the present invention includes a semiconductor laser element, a support member and a wavelength conversion member. The support member defines a through-hole through which laser light emitted from the semiconductor laser element passes. The wavelength conversion member has a lateral surface fixed to an inner wall of the through-hole, a first main surface having a first region to which the laser light is incident, a second main surface opposite to the first main surface, and an inclined surface connected to the second main surface and the lateral surface. The inclined surface is inclined such that a thickness of a peripheral portion of the wavelength conversion member is thinner than a thickness of a center portion of the wavelength conversion member. The inclined surface partially overlaps with the first region of the first main surface in plan view.

According to the present disclosure, there can be provided a light emitting device including a laser element, the light emitting device being capable of reducing color unevenness.

DETAILED DESCRIPTION OF EMBODIMENTS

Figure 1A:
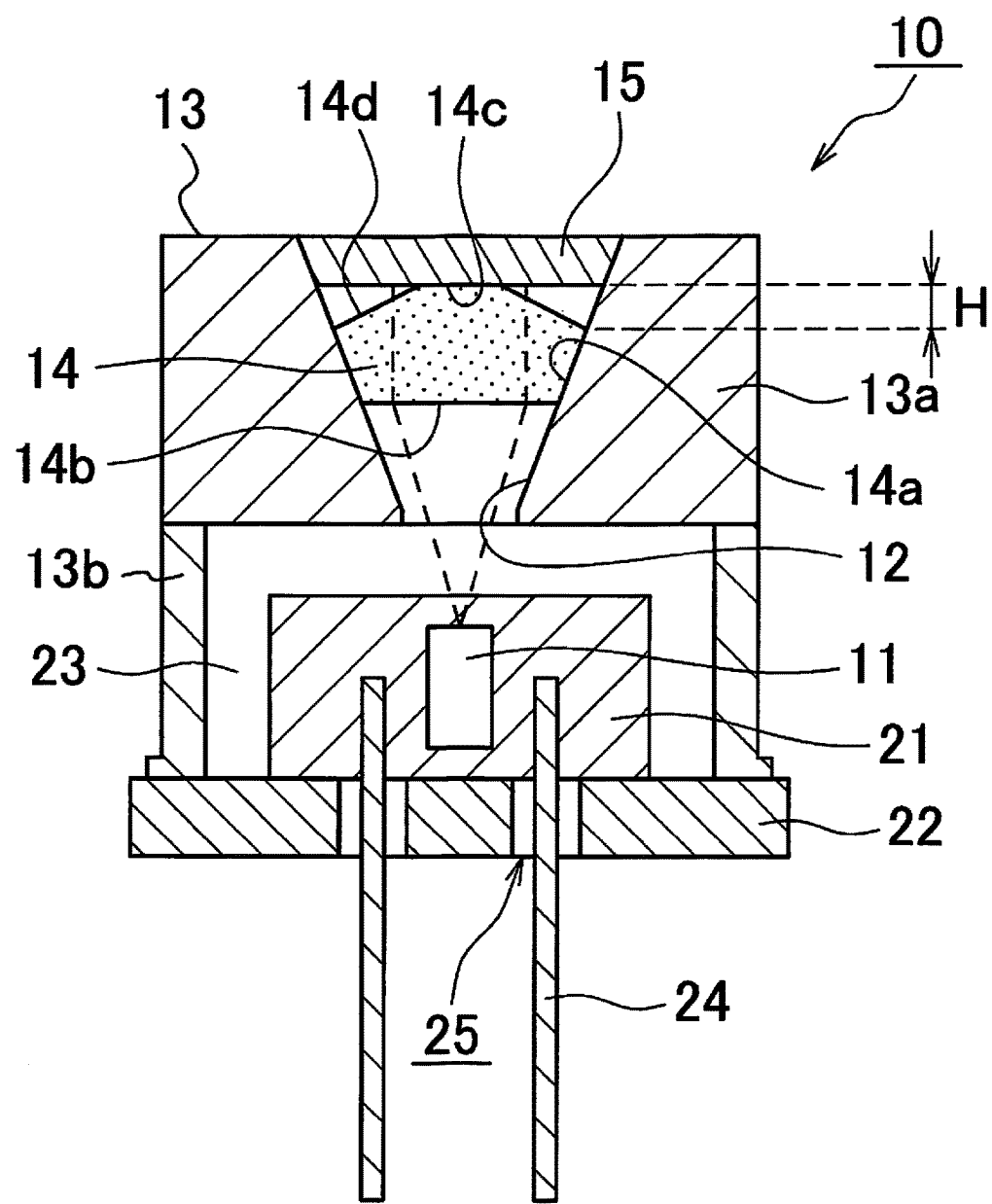
FIG. 1A is a schematic sectional view for explaining one embodiment of a light emitting device.

The forms shown below are illustrative for the purpose of putting the technical concept of the present invention into a concrete shape, and are not intended to limit the present invention to the following forms. The sizes, positional relations and so on of members shown in the drawings may be exaggerated for clarifying explanation. Further, like names and symbols denote like members or members of the same quality in general, and duplicated explanations are appropriately omitted.

First Embodiment

A light emitting device 10 of this embodiment includes a semiconductor laser element 11, a support member 13 and a wavelength conversion member 14 as shown in FIG. 1A. The support member 13 is a member for supporting the wavelength conversion member 14, and is provided with a through-hole 12 through which laser light emitted from the semiconductor laser element 11 passes. The wavelength conversion member 14 has a lateral surface 14a, a first main surface 14b, a second main surface 14c being a surface opposite to the first main surface 14b, and an inclined surface 14d. The lateral surface 14a is fixed to the inner wall of the through-hole 12. The first main surface 14b is a surface to which laser light is incident. The inclined surface 14d is inclined so as to reduce the thickness as the peripheral edge is approached from the center, and the inclined surface 14d is connected to both the second main surface 14c and the lateral surface 14a. The light emitting device 10 may further include a light-transmissive member 15 on the second main surface 14c side of the wavelength conversion member 14. Here, the light-transmissive member 15 is disposed so as to be partially in contact with the second main surface 14c, and a gap 16 is disposed so as to be surrounded by the inner wall of the through-hole 12, the inclined surface 14d and the light-transmissive member 15.

In the light emitting device 10, the color intensity of light (e.g. blue light) from the semiconductor laser element 11 at the central part can be effectively reduced owing to the above-mentioned configuration. Specifically, if the wavelength conversion member has a constant thickness, light extracted from the light emitting device has such a distribution that the intensity of light from the semiconductor laser element 11 is high at the central part and the intensity of wavelength-converted light (e.g. yellow light) is relatively high at the peripheral edge in response to an output distribution of laser light. Thus, the wavelength conversion member 14 is thickened at a portion of the distribution with a high output, and thinned at a portion of the distribution with a relatively low output. Accordingly, at a portion with a relatively high output in the output distribution of laser light, the amount of a fluorescent material increases along the thickness direction, leading to an increase in wavelength conversion, and at a portion with a relatively low output in the output distribution of laser light, the amount of a fluorescent material decreases along the thickness direction, leading to a decrease in wavelength conversion. In addition, by providing the inclined surface 14d, light in the wavelength conversion member 14 can be reflected toward the second main surface 14c. Accordingly, light emitted from the second main surface 14c can be mixed light in which light reflected at the inclined surface 14d is mixed together.

As a result, color unevenness can be effectively remedied to obtain light of a desired color (e.g. white light) with a relatively uniform light distribution.

(Semiconductor Laser Element 11)

The semiconductor laser element 11 can be used without particular limitation as long as it is capable of emitting laser light. Examples thereof include those having a light emission peak wavelength of 300 nm to 500 nm, preferably 430 nm to 470 nm or 400 nm to 470 nm, more preferably 420 nm to 470 nm. Laser light in such a wavelength range is suitable for excitation of a YAG-type fluorescent material. Examples of the laser element that emits laser light in such a wavelength range include laser elements obtained using a nitride semiconductor. One light emitting device may include a plurality of semiconductor laser elements.

(Support Member 13)

The support member 13 has the through-hole 12 extending from the lower side (light-incident side on which laser light emitted from the semiconductor laser element 11 is incident) to the upper side (light-emitting side) to support the wavelength conversion member 14. Since the through-hole 12 is formed so as to extend to the upper side, some light traveling to the lower side from the wavelength conversion member 14 can be reflected and extracted to the upper side. In other words, the through-hole 12 of the support member 13 extends along the traveling direction of light, i.e. the diameter or length of the through-hole 12 increases along the traveling direction of major light, and this means that the through-hole 12 has a surface that forms a tapered shape.

Figure 1B:
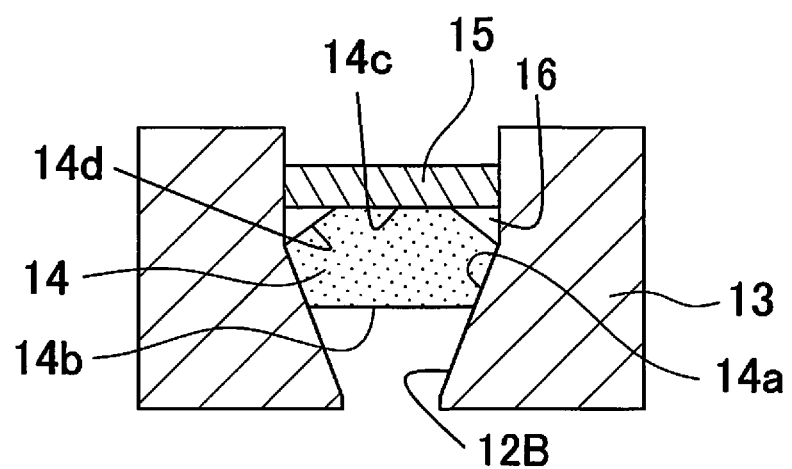
FIG. 1B is a schematic sectional view showing a modification of a support member to be used in the light emitting device in FIG. 1A.
Figure 1C:
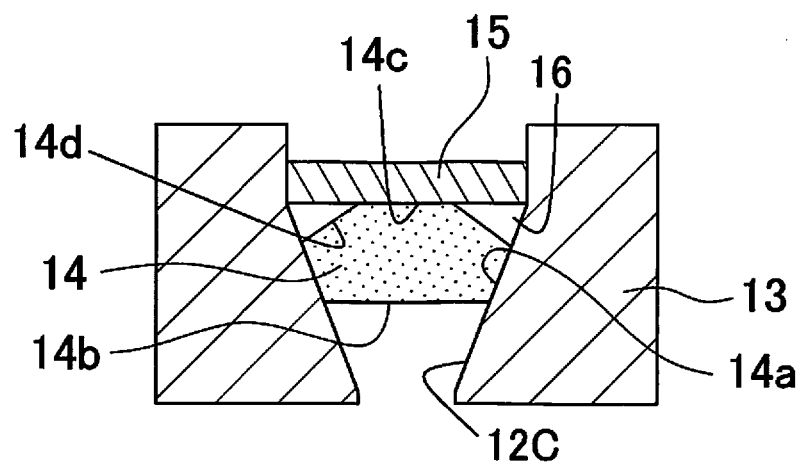
FIG. 1C is a schematic sectional view showing another modification of a support member to be used in the light emitting device in FIG. 1A.

The through-hole 12 can be formed in various shapes such as circular, elliptic and polygonal shapes in plan view from above the support member 13. Among them, a circular or elliptic shape is preferable because a spot of laser light has an elliptic shape. The through-hole 12 may have a shape in which the diameter of the cross-section gradually increases over the whole through-hole from the lower side to the upper side (see FIG. 1A), or through-holes 12B and 12C may have a shape in which the size of only a part of the through-hole gradually increases (see FIGS. 1B and 1C).

The size of the through-hole 12 includes, for example, an optical axis of laser light emitted by the semiconductor laser element 11 in the smallest portion (i.e. laser light-incident side). The size of the through-hole 12 on the laser light-incident side is preferably not smaller than such a size that the through-hole 12 includes the whole of the spot of laser light. Accordingly, substantially the whole of laser light can be introduced into the through-hole 12. Specifically, the size of the through-hole is 1 to 10 times, preferably 1.5 to 5 times as large as the size of the spot of laser light. The size of the through-hole 12 is 2 to 12 times, preferably 2.5 to 6 times as large as the size of the spot of laser light at the largest portion (i.e. light-emitting side). Accordingly, a reduction in luminance of light extracted to the outside from the through-hole 12 can be suppressed. The degree of extension of the through-hole 12 from the lower side to the upper side can be appropriately set according to the shape of a wavelength conversion member to be used. Preferably, the through-hole 12 includes a portion partially conforming to the form of the lateral surface of the wavelength conversion member. Accordingly, the contact area with the wavelength conversion member can be improved to achieve firm fixation.

The support member 13 may be in the form of a flat plate having the through-hole 12, or may have a tubular portion that supports a flat plate at the peripheral edge part of the flat plate having a through-hole. For example, as shown in FIG. 1A, the support member 13 may have a disc-shaped seat portion 13a having the through-hole 12 formed almost coaxially with the optical axis of laser light emitted by the semiconductor laser element 11, and a cylindrical sleeve portion 13b that supports the peripheral edge part of the seat portion 13a at the lower surface of the seat portion 13a, i.e. a surface of the seat portion 13a on the semiconductor laser element 11 side. The seat portion 13a and the sleeve portion 13b may be formed as one united body, or may be formed by bonding separate bodies.

Examples of the material of the support member 13 include ceramics and metals. Examples of the ceramic include alumina. Examples of the metal include iron, nickel, cobalt, aluminum and alloys thereof, for example stainless steel, Ni—Fe alloys and KOVAR®. For example, the support member 13 may have the sleeve portion 13b formed of a ceramic and the seat portion 13a formed of a metal. The wall surface of the through-hole 12 may be provided with, for example, a reflecting layer composed of a material containing silver. Accordingly, light extraction efficiency can be further improved.

(Wavelength Conversion Member 14)

Figure 2:
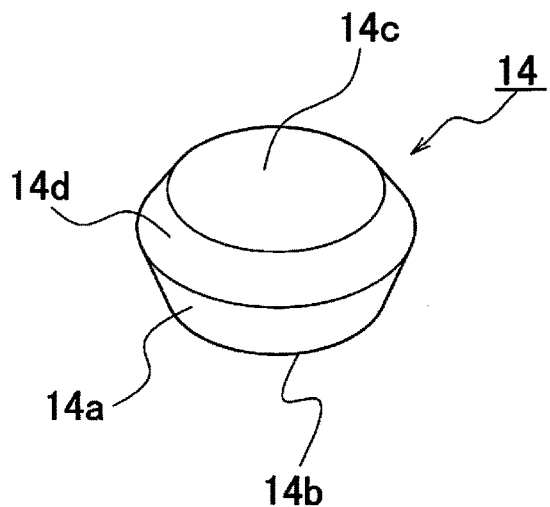
FIG. 2 is a perspective view of a wavelength conversion member to be used in the light emitting device in FIG. 1A.

The wavelength conversion member 14 is a member for wavelength-converting light from the semiconductor laser element 11. The wavelength conversion member 14 includes at least a fluorescent material (first fluorescent material), and wavelength-converts light from, for example, the semiconductor laser element 11 into light having a longer wavelength. As shown in FIGS. 1 and 2, the wavelength conversion member 14 has the lateral surface 14a, the first main surface 14b, the second main surface 14c being a surface opposite to the first main surface 14b, and the inclined surface 14d. The lateral surface 14a is fixed to the inner wall of the through-hole 12. The first main surface 14b is a surface to which laser light is incident, and the second main surface 14c is a surface opposite to the first main surface 14b. Light emitted from the second main surface 14c is used as emitted light from the light emitting device 10. Preferably, both the first main surface 14b and the second main surface 14c are flat. Preferably, the first main surface 14b and the second main surface 14c are substantially parallel to each other. Preferably, the wavelength conversion member 14 is fixed to the support member 13 in such a manner that the first main surface 14b and the second main surface 14c substantially vertically cross the optical axis of laser light emitted by the semiconductor laser element 11.

The lateral surface 14d is inclined so as to reduce the thickness as the peripheral edge is approached from the center. Here, the center and the peripheral edge mean the center and the peripheral edge of the wavelength conversion member 14 in plan view where the wavelength conversion member 14 is seen from the light-emitting surface side, i.e. in plan view from the second main surface side. The plan view encompasses a case where the wavelength conversion member 14 is observed transparently. The inclined surface 14d is connected to both the second main surface 14c and the lateral surface 14a. In plan view from the second main surface 14c side, the inclined surface 14d may be disposed so as to surround only a part of the second main surface 14c, but the inclined surface 14d is preferably disposed so as to surround the whole of the second main surface 14c. Accordingly, color unevenness can be reduced on the whole periphery by the inclined surface 14d. For example, the inclined surface 14d occupies 10% to 90%, preferably 20% to 80%, more preferably 30% to 70% of the area of the wavelength conversion member 14 in plan view from the second main surface 14c side.

The inclined surface 14d is preferably a flat surface. In other words, the inclined surface 14d is preferably a linear inclined surface in sectional view in a direction vertical to the second main surface 14c. Here, the angle with respect to the second main surface 14c, i.e. the angle formed by the inclined surface 14d and the second main surface 14c, may be preferably more than 90°, and for example, 100° or more, 115° or more, or 120° or more with respect to the second main surface 14c. Moreover, the angle formed by the inclined surface 14d and the second main surface 14c may be preferably 175° or less, and for example, 160° or less, or 150° or less with respect to the second main surface 14c. For example, the angle is in the range of greater than 90° and equal to or less than 175°, between 100° and 160% or between 110° and 150°. By this inclined surface, light from the first main surface 14b can be reflected toward the second main surface 14c, and extracted from the second main surface 14c. The height of the inclined surface 14d in terms of a height between the second main surface 14c and the joint portion between the lateral surface 14a and the inclined surface 14d (H in FIG. 1A) is preferably 10 to 70%, more preferably 20 to 40%, of the maximum thickness of the wavelength conversion member 14. Accordingly, the inclined surface 14d in the wavelength conversion member can be balanced to effectively reduce color unevenness. For example, the maximum thickness of the wavelength conversion member 14 is 50 to 500 μm. The height H of the inclined surface is 5 to 350 μm.

Preferably, the end of the inclined surface 14d on the center side is situated closer to the center than the end of the first main surface 14b when observed transparently in plan view. Here, it is preferable that when observed transparent in plan view, the end of the second main surface 14c, i.e. the connection part between the second main surface 14c and the inclined surface 14d is disposed closer to the center than a concentric shape occupying 90% of the area of the first main surface 14b, closer to the center than a concentric shape occupying 80% of the area of the first main surface 14b, or closer to the center than a concentric shape occupying 60% of the area of the first main surface 14b. Accordingly, trapping of light in the later-described gap defined by the inclined surface 14d can be reduced.

The inclined surface is situated to partially overlap a region of the first main surface, which is irradiated with laser light, in plan view from the second main surface side. The inclined surface may be disposed at a position other than a position immediately above the central part of laser light, i.e. immediately above a portion at which the intensity is the maximum. Specifically, the inclined surface 14d is disposed preferably at a position other than a position immediately above a portion at which the intensity is 90% or more of the maximum value of laser light, more preferably at a position other than a position immediately above a portion at which the intensity is 50% or more of the maximum value of laser light.

The wavelength conversion member 14 may be formed substantially only of a fluorescent material, or may be formed of a fluorescent material and a binder for binding the fluorescent material. Examples of the fluorescent material include YAG-type fluorescent materials. Two or more fluorescent materials may be used. Above all, YAG-type fluorescent materials are preferable because they have high durability to laser light, and can be combined with a blue laser to obtain white light. The binder is preferably an inorganic material. Accordingly, degradation, discoloration and the like of the binder, which are caused by light emitted from the laser element, can be suppressed. Examples of the inorganic material include $Al_2O_3$, $Y_2O_3$, $SiO_2$, $TiO_2$, $ZrO_2$, BaO and glass. The fluorescent material can be included in an amount of, for example, 0.05% by weight to 100% by weight, more specifically 5% by weight to 30% by weight, based on the total weight of the wavelength conversion member 14.

The wavelength conversion member 14 is provided so as to close the through-hole 12. For example, the wavelength conversion member 14 is disposed so as to be wholly stored in the through-hole 12.

The first main surface 14b and/or the second main surface 14c may be provided with a functional film as necessary. As the wavelength conversion member 14, one obtained by mixing a fluorescent material, a binder, and components such as a light scattering material as necessary, and molding the resultant mixture in a desired shape and size in accordance with a known method such as sintering can be used. The wavelength conversion member 14 can be fixed to the support member 13 by bonding the wavelength conversion member 14 to the inner wall of the through-hole 12 by melting of the wavelength conversion member 14 itself or with a bonding member such as low-melting-point glass interposed therebetween.

(Light-Transmissive Member 15)

As shown in FIG. 1A, the light-transmissive member 15 may be provided on the second main surface 14c side of the wavelength conversion member 14. The light-transmissive member 15 is preferably one that is capable of transmitting light from the wavelength conversion member 14 and capable of being fixed to the support member 13. The light-transmissive member 15 partially or wholly covers the second main surface 14c of the wavelength conversion member 14. The light-transmissive member 15 may be separated from the wavelength conversion member 14, but the light-transmissive member 15 is preferably in contact with the wavelength conversion member 14. When the light-transmissive member 15 fixed to the support member 13 is in contact with the wavelength conversion member 14, heat from wavelength conversion member 14 can be dissipated to the support member 13 through the light-transmissive member 15. The light-transmissive member 15 may be disposed outside the through-hole 12, or partially protruded from the through-hole 12, or wholly disposed in the through-hole 12.

Preferably, the light-transmissive member 15 has a flat shape such as a film shape, a sheet shape or a flat plate shape, but irregularities may exist on a part or the whole of a third main surface on the wavelength conversion member 14 side and/or a fourth main surface on a side opposite to the third main surface. In any case, the third main surface and the fourth main surface are preferably parallel to each other. The light-transmissive member 15 is preferably thin for improving light extraction efficiency. For example, the maximum thickness of the light-transmissive member 15 is smaller than the maximum thickness of the wavelength conversion member.

Preferably, the light-transmissive member 15 has the quality of scattering light. Accordingly, color unevenness of emitted light from the light emitting device 10 can be further reduced. For example, the light-transmissive member 15 may contain a fluorescent material (second fluorescent material). As the second fluorescent material, one different from the first fluorescent material can be selected, and as the second fluorescent material, one capable of being excited by light from the semiconductor laser element 11 and/or fluorescence from the wavelength conversion member 14 is selected. For example, the wavelength conversion member 14 has a yellow fluorescent material, and the light-transmissive member 15 has a red fluorescent material. Two or more fluorescent materials may be used. The content of the second fluorescent material is, for example, 0.05% by weight to 50% by weight, preferably 1% by weight to 15% by weight, based on the total weight of the light-transmissive member 15. Particularly, the content of the second fluorescent material is preferably lower than the content of the fluorescent material in the wavelength conversion member 14 (i.e. the weight of the second fluorescent material per unit volume is small). The light-transmissive member 15 may contain a light scattering material.

As the light-transmissive member 15, one obtained by blending optional components such as a fluorescent material and a light scattering material with a material such as glass as necessary, and molding the resultant blend into a desired shape and size can be used. Examples of the main material that forms the light-transmissive member 15 include glass such as soda glass (or soda lime glass), borosilicate glass and lead glass.

(Gap 16)

In the light emitting device 10, the wavelength conversion member 14 is disposed in the through-hole 12 of the support member 13 with the gap 16 between the inner wall of the through hole 12 and the inclined surface 14d. When further the light-transmissive member 15 is disposed, the gap 16 is surrounded by the inner wall of the through-hole 12, the inclined surface 14d and the light-transmissive member 15. The size and shape of the gap 16 can be appropriately adjusted by the shape of the through-hole 12 of the support member 13 and the form of the inclined surface of the wavelength conversion member 14. Preferably, the gap 16 is filled with a gas such as air.

For reducing the color intensity of light (e.g. blue light) from the semiconductor laser element at the central part of laser light, the fluorescent material concentration at a portion of the wavelength conversion member, which corresponds to the central part of laser light, can be improved. However, when the fluorescent material concentration is generally increased, the ratio of light emitted from the fluorescent material to light from the semiconductor laser element increases at a portion other than the central part, so that color unevenness cannot be remedied. When the fluorescent material concentration is to be varied in one wavelength conversion member, manufacturing becomes difficult. Particularly, laser light has high energy, and therefore the material of the wavelength conversion member is limited. Thus, the above-described gap 16 is disposed. Specifically, a peripheral edge part of the wavelength conversion member 14 on the second main surface 14c side is removed to form a shape inclined so as to reduce the thickness as the peripheral edge is approached from the center. Accordingly, the fluorescent material content in the total thickness direction in the vicinity of the center of the wavelength conversion member 14 and the fluorescent material content in the total thickness direction in the vicinity of the peripheral edge of the wavelength conversion member 14 can be varied, and therefore color unevenness can be effectively remedied. In other words, a fluorescent material distribution matching an output distribution of laser light in which the intensity of wavelength-converted light is high at the central part, and low at the peripheral part can be achieved.

The gap 16 can be disposed in position by an extremely simple method in which only the wavelength conversion member 14 is processed for achieving disposition of the gap 16.

Further, in a structure in which a gap as described above is not provided because a plate-shaped wavelength conversion member is used, light is leaked to a support member provided with a through-hole, and dull light is emitted from the periphery of the through-hole, but by providing the gap 16, such leakage of light can be reduced. By providing the gap 16 that is in contact with the inclined surface 14d, light emitted from the wavelength conversion member 14 can be reflected at the inclined surface 14d. Accordingly, light can be concentrated on the central part, so that the luminance can be improved.

(Other Members)

In the light emitting device 10, the semiconductor laser element 11 is used in the form of a package together with the above-described support member 13 etc. The semiconductor laser element 11 is fixed to a plate-shaped stem 22 using a heat sink 21, and an internal space 23 including the semiconductor laser element 11 is hermetically sealed with the stem 22 and the support member 13. In the stem 22, a plurality of lead terminals 24 for establishing electrical connection to an external electrical power are disposed such that each of the lead terminals 24 extend through each of a plurality of through-holes 25 provided in the stem 22. The through-holes 25 can be further hermetically sealed with a sealing material composed of a material such as low-melting-point glass. The semiconductor laser element 11 is electrically connected to the lead terminals 24 through an electrically conductive member such as a wire. For example, a member capable of concentrating laser light, such as a lens, may be provided between the semiconductor laser element 11 and the wavelength conversion member 14. When laser light passes through an optical fiber, difference in intensity between the center and the outer periphery of laser light is easily reduced because the laser light is propagated through the optical fiber. However, in a structure in which laser light is applied to the wavelength conversion member 14 without passing through an optical fiber, the laser light is apt to be applied while there is a large difference in intensity between the center and the outer periphery. Thus, it is preferable to provide the inclined surface 14d particularly when an optical fiber is not used. Alternatively, a lens for controlling the orientation of mixed color light of fluorescence and laser light emitted from the light emitting device 10 may be provided outside the light emitting device 10.

Second Embodiment

Figure 3A:
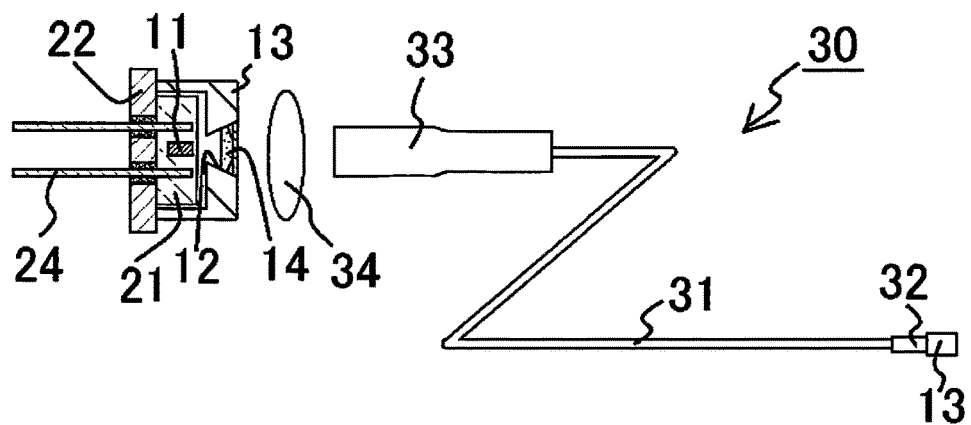
FIG. 3A is a schematic sectional view for explaining a second embodiment of a light emitting device.
Figure 3B:
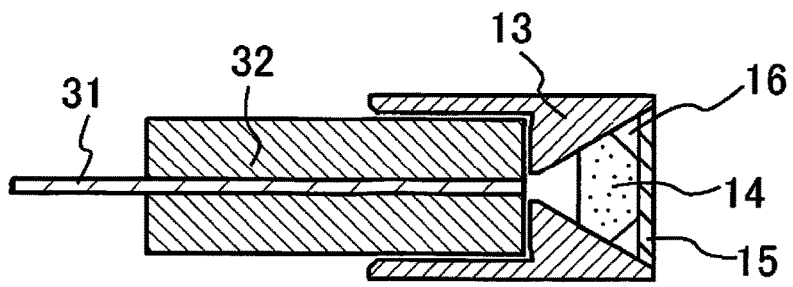
FIG. 3B is a schematic sectional view for explaining the second embodiment of a light emitting device.

In a light emitting device 30 of this embodiment, an optical fiber 31 is disposed between a semiconductor laser element 11 and a wavelength conversion member 14 as shown in FIGS. 3A and 3B. Accordingly, the wavelength conversion member 14 can be irradiated with light from the semiconductor laser element 11 by propagating the light through the optical fiber 31 to the wavelength conversion member 14. Thus, the relative positional relation between the semiconductor laser element 11 and the wavelength conversion member 14 can be relatively freely designed. The optical fiber 31 can be composed of, for example, quartz glass. As shown in FIG. 3A, a connector 33 is disposed at an end of the optical fiber 31, i.e. an end on the semiconductor laser element 11 side, for facilitating connection between the optical fiber 31 and the semiconductor laser element 11 or a device including the semiconductor laser element 11. For example, a lens 34 etc. may be disposed between the connector 33 and the semiconductor laser element 11 or the device including the semiconductor laser element 11. As shown in FIG. 3B, a tip member 32 is disposed at the other end of the optical fiber 31, i.e. an end on the wavelength conversion member 14 side of the optical fiber 31, for establishing connection to a support member 13. The tip member 32 is disposed so as to surround the outer periphery of the optical fiber 31.

A light emitting device of the present disclosure can be used in various applications which require wavelength-converted light, particularly high-output white light. For example, the light emitting device can be used as a light source for lighting apparatuses for endoscope devices and fiber scopes, lighting apparatuses to be used indoors and outdoors, and lighting apparatuses for vehicles (e.g. headlights).

What is claimed is:

1. A light emitting device comprising:
    a semiconductor laser element;
    a support member defining a through-hole through which laser light emitted from the semiconductor laser element passes; and
    a wavelength conversion member having
        a lateral surface fixed to an inner wall of the through-hole,
        a first main surface having a first region to which the laser light is incident,
        a second main surface opposite to the first main surface, and
        an inclined surface connected to the second main surface and the lateral surface, the inclined surface being inclined such that a thickness of a peripheral portion of the wavelength conversion member is thinner than a thickness of a center portion of the wavelength conversion member, the inclined surface partially overlapping with the first region of the first main surface in plan view.

2. The light emitting device according to claim 1, wherein the inclined surface surrounds the second main surface in plan view.

3. The light emitting device according to claim 1, wherein the inclined surface is a flat surface.

4. The light emitting device according to claim 1, wherein an angle formed by the inclined surface and the second main surface is greater than 90° and equal to or less than 175°.

5. The light emitting device according to claim 1, wherein the inclined surface occupies 20 to 80% of an area of the wavelength conversion member in plan view.

6. The light emitting device according to claim 1, further comprising
    a light-transmissive member disposed on a second main surface side of the wavelength conversion member with a gap between the inclined surface and the light-transmissive member.

7. The light emitting device according to claim 6, wherein the inclined surface surrounds the second main surface in plan view.

8. The light emitting device according to claim 6, wherein the inclined surface is a flat surface.

9. The light emitting device according to claim 6, wherein an angle formed by the inclined surface and the second main surface is greater than 90° and equal to or less than 175°.

10. The light emitting device according to claim 6, wherein the inclined surface occupies 20 to 80% of the area of the wavelength conversion member in plan view.

11. The light emitting device according to claim 6, wherein the wavelength conversion member contains a first fluorescent material, and the light-transmissive member contains a second fluorescent material different from the first fluorescent material.

12. The light emitting device according to claim 11, wherein the wavelength conversion member has a maximum thickness larger than a maximum thickness of the light-transmissive member.

* * * * *